(12) United States Patent
Milo et al.

(10) Patent No.: US 12,708,008 B2
(45) Date of Patent: Aug. 11, 2026

(54) ELECTRONIC PACKAGE WITH CONCAVE LEAD END FACES

(71) Applicant: TEXAS INSTRUMENTS INCORPORATED, Dallas, TX (US)

(72) Inventors: Dolores Babaran Milo, Baguio City (PH); Ernesto Pentecostes Rafael, Jr., Magalang (PH); John Carlo Cruz Molina, Limay (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 886 days.

(21) Appl. No.: 17/316,703

(22) Filed: May 10, 2021

(65) Prior Publication Data

US 2022/0359352 A1 Nov. 10, 2022

(51) Int. Cl.

| | |
|---|---|
| ***H10W 70/65*** | (2026.01) |
| ***H10W 70/04*** | (2026.01) |
| ***H10W 74/01*** | (2026.01) |
| ***H10W 74/10*** | (2026.01) |
| ***H10W 90/00*** | (2026.01) |

(52) U.S. Cl.

CPC ....... *H10W 70/657* (2026.01); *H10W 70/041* (2026.01); *H10W 70/042* (2026.01); *H10W 70/047* (2026.01); *H10W 70/048* (2026.01); *H10W 70/65* (2026.01); *H10W 74/016* (2026.01); *H10W 74/114* (2026.01); *H10W 90/701* (2026.01)

(58) Field of Classification Search

CPC ........... H01L 23/3121; H01L 23/49805; H01L 23/49811; H01L 23/49838; H01L 21/4828; H01L 21/4825; H01L 21/4839; H01L 21/565; H10W 90/756; H10W 90/736; H10W 74/00; H10W 74/016; H10W 72/884; H10W 72/5522; H10W 70/411; H10W 70/421; H10W 70/657; H10W 70/65; H10W 70/041; H10W 70/042; H10W 70/047

See application file for complete search history.

(56) References Cited

U.S. PATENT DOCUMENTS

| | | | |
|---|---|---|---|
| 7,115,446 | B2 | 10/2006 | Koo et al. |
| 7,245,023 | B1 | 7/2007 | Lin |
| 7,521,291 | B2 | 4/2009 | Masumoto |
| 8,022,512 | B2 | 9/2011 | Ramos et al. |
| 8,216,885 | B2 | 7/2012 | Holloway |
| 8,492,906 | B2 | 7/2013 | Nondhasitthichai et al. |
| 8,581,113 | B2 | 11/2013 | Sanjuan et al. |

(Continued)

*Primary Examiner* — John M Parker

(74) *Attorney, Agent, or Firm* — Dawn Jos; Frank D. Cimino

(57) ABSTRACT

An electronic package includes an electronic component including terminals, a plurality of leads, at least some of the leads being electrically coupled to the terminals within the electronic package, and a mold compound covering the electronic component and partially covering the leads. Each of the leads include an exposed bottom face coplanar with a bottom surface of the mold compound and an exposed end face coplanar with one of a plurality of side surfaces of the mold compound. For at least some of the leads, the exposed end face includes a narrow portion forming a concave recess, the narrow portion being between top and bottom edges of the exposed end face.

17 Claims, 10 Drawing Sheets

(56) References Cited

U.S. PATENT DOCUMENTS

| | | | |
|---|---|---|---|
| 8,847,413 | B2 | 9/2014 | Yee et al. |
| 9,184,120 | B1 | 11/2015 | Babaran et al. |
| 9,373,569 | B1 | 6/2016 | Javier et al. |
| 9,768,137 | B2 | 9/2017 | Chen et al. |
| 9,966,326 | B2 | 5/2018 | Mustanir et al. |
| 9,972,558 | B1 * | 5/2018 | Talledo ............... H10W 70/465 |
| 10,083,866 | B2 | 9/2018 | Bin Mohd Arshad et al. |
| 2009/0159320 | A1 * | 6/2009 | Sanjuan .................. H01L 24/97 29/840 |
| 2014/0151865 | A1 | 6/2014 | Koschmieder |
| 2016/0148876 | A1 * | 5/2016 | Kitnarong ............... H01L 22/14 257/666 |
| 2019/0067212 | A1 * | 2/2019 | Cadag ..................... H01L 21/78 |
| 2019/0198454 | A1 * | 6/2019 | Talledo ............... H10W 42/121 |
| 2019/0214334 | A1 * | 7/2019 | Ikeda ................ H01L 23/49582 |
| 2019/0279921 | A1 * | 9/2019 | Kadoi ................. H01L 21/4828 |
| 2019/0378783 | A1 | 12/2019 | Castro et al. |
| 2020/0286816 | A1 | 9/2020 | Komatsu et al. |
| 2020/0312754 | A1 * | 10/2020 | Yasuda ............. H01L 23/49582 |
| 2021/0090904 | A1 | 3/2021 | Cook et al. |

* cited by examiner

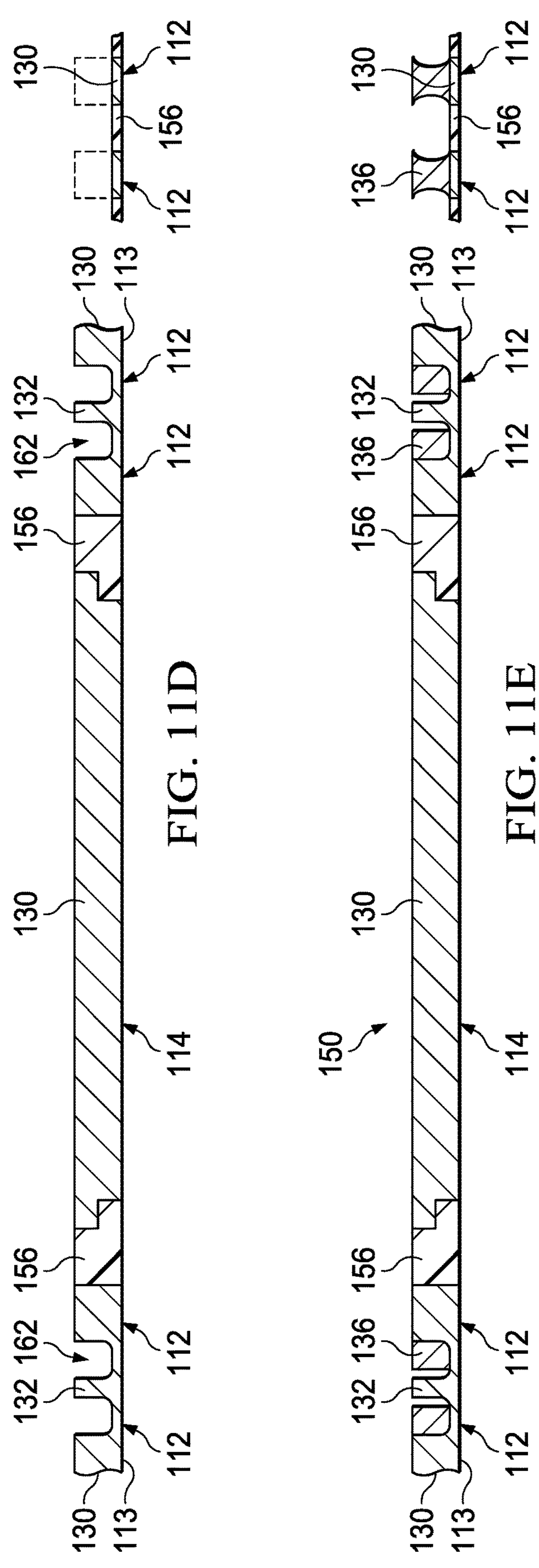
130
156
112
112
130
113
132
162
112
156
130
114
156
162
132
130
113
FIG. 11D
136
150
FIG. 11E
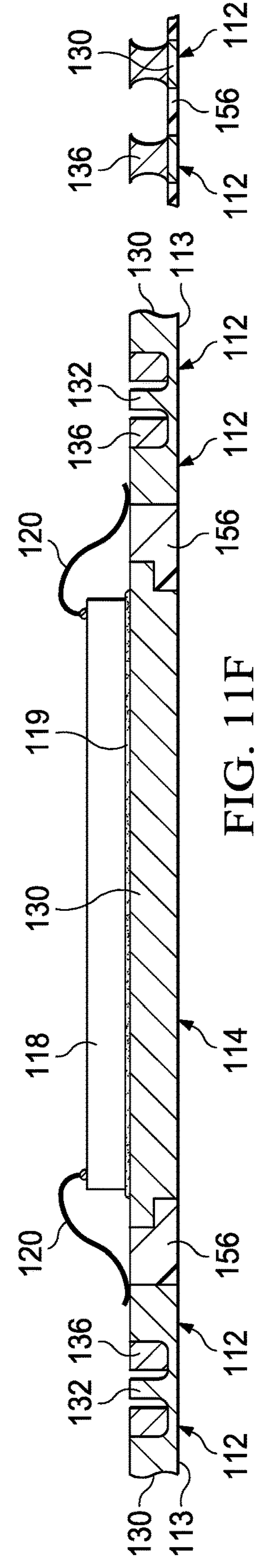
130
156
136
112
113
132
120
119
118
114
FIG. 11F

ELECTRONIC PACKAGE WITH CONCAVE LEAD END FACES

TECHNICAL FIELD

This disclosure relates to electronic packages, and more particularly, to electronic packages with leads.

BACKGROUND

Component packaging is often driven by the consumer electronics market with less consideration given to higher reliability industries such as automotive, medical, industrial, and aviation. Improved packaging technologies and component miniaturization can often lead to new or unexpected design, manufacturing, and reliability issues. This has been the case with leadless packages, for example, Quad-Flat No-leads (QFN) and Small-Outline No-leads (SON), also referred to as Dual-Flat No-leads (DFN), especially when it comes to adoption by new non-consumer electronic original equipment manufacturers. Integration of leadless package families, such as QFN/SON, into high reliability environments can be difficult.

Unlike for leaded packages, in QFN/SON, the electrical contacts or terminals are inset into the mold cap as leads. Nothing extends from the package in order to surface mount. This feature of the leadless packages, including QFN/SON, allows them to be small, on the order chip-scale. However, high reliability environments often require visual inspection of solder connections between leads and wiring substrates, such as printed wiring boards (PWBs) or printed circuit boards (PCBs). To support visual inspection of solder connections, leads may include exposed end faces coplanar with a side of the package. Soldering the lead to the wiring substrate causes solder to form a fillet on the exposed end face, thereby facilitating visual as often required for high reliability environments.

BRIEF SUMMARY

While exposed lead end faces support visual inspection between leads and wiring substrates, they can cause issues with manufacturing. To expose the lead end faces, package singulation includes cutting the lead ends with the mold compound of the package. However, such cutting may cause metal smearing and/or metal burrs extending from the exposed end faces of the leads. Such metal smearing and/or metal burrs may cause failed inspections of leadless packages or even shorting between adjacent leads after mounting to a wiring substrate.

As disclosed herein, leadless packages provide additional clearance between adjacent leads without adjusting the pitch (lead to lead spacing) of the leads. The additional clearance may mitigate shorting due to metal smearing and/or metal burrs created during a singulation process and/or allow singulated packages to pass inspection by providing required clearances between leads even in view of metal smearing and/or metal burrs. Also disclosed are leadframe strips including leads that provide such additional clearance following singulation.

As one example, an electronic package includes an electronic component including terminals, a plurality of leads, at least some of the leads being electrically coupled to the terminals within the electronic package, and a mold compound covering the electronic component and partially covering the leads. Each of the leads include an exposed bottom face coplanar with a bottom surface of the mold compound and an exposed end face coplanar with one of a plurality of side surfaces of the mold compound. For at least some of the leads, the exposed end face includes a narrow portion forming a concave recess, the narrow portion being between top and bottom edges of the exposed end face.

In another example, a method for manufacturing an electronic package includes connecting terminals of an electronic component to a plurality of leads, and covering the electronic component and partially covering the leads with a mold compound. At least some of the leads include an exposed bottom face coplanar with a bottom surface of the mold compound and a lead end including a narrow portion forming a concave recess, the narrow portion being between top and bottom edges of the exposed end face.

In another example, a leadframe strip for an array of electronic packages includes a patterned base metal forming leads for each of the array of electronic packages, and a premold material filling a first partial etch of a first side of the base metal. The patterned base metal forms rectangular base portions of the base metal at lead ends of the leads on a second side of the base metal. Each of the lead ends includes a second metal over the rectangular base portion of the lead end on the second side of the base metal, the second metal forming a narrow portion forming a concave recess on the rectangular base portion.

In another example, a method of forming a leadframe strip for an array of electronic packages includes patterning a base metal to form leads for each of the array of electronic packages, partially etching a first side of the base metal, premolding the base metal, filling the partial etch of the first side of the base metal with a premold material, partially etching a second side of the base metal to form rectangular base portions of lead ends of the leads, and for each of the rectangular base portions of the lead ends, 3D printing a narrow portion forming a concave recess on the rectangular base portion.

BRIEF DESCRIPTION OF THE DRAWINGS

FIGS. 11A-11H each illustrate cutaway front and side views of conceptual process steps for manufacturing a QFN package with leads having exposed end faces including narrow portions forming concave recesses, such as the package of FIG. 8.

DETAILED DESCRIPTION

Figure 1:
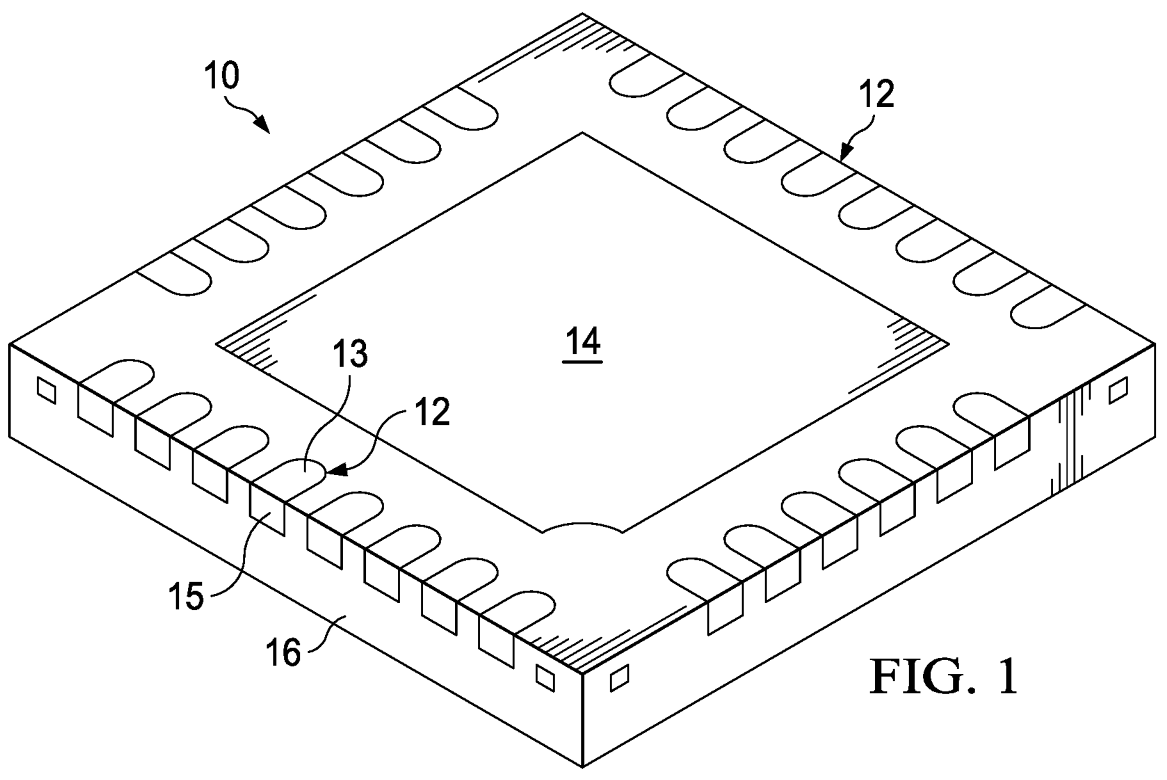
FIG. 1 is a perspective view of a bottom surface of a 28-pin, single row, QFN package.
Figure 2:
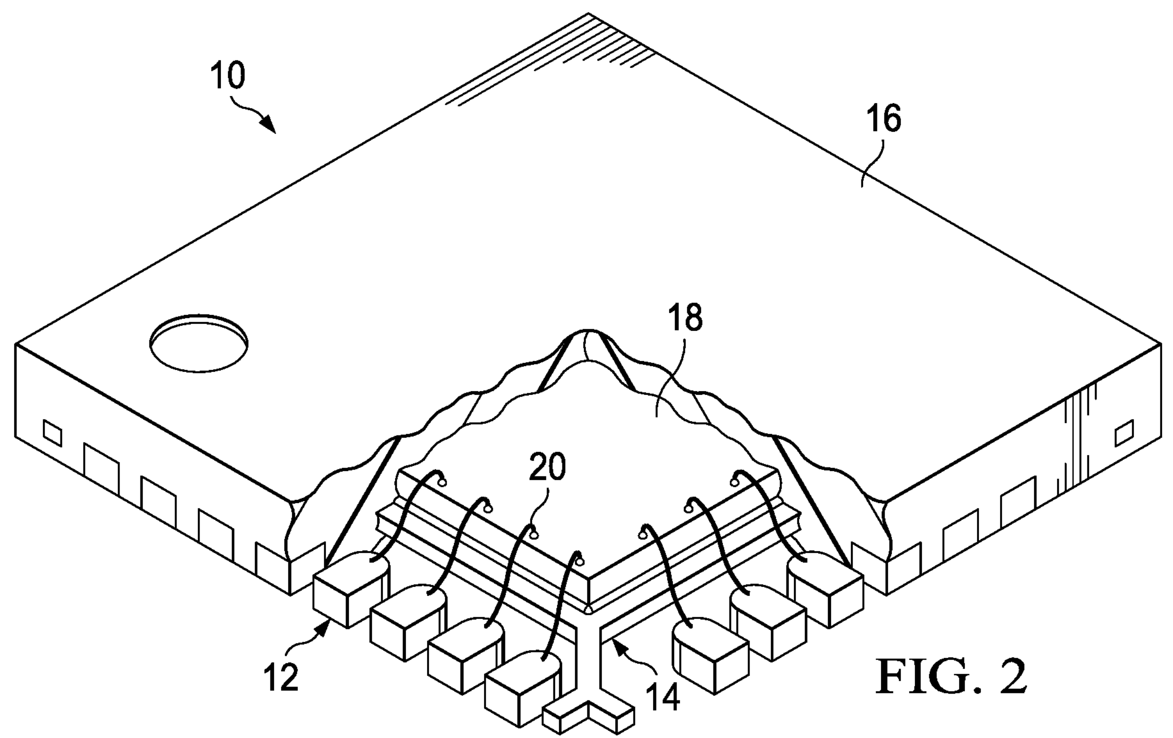
FIG. 2 is a perspective view of a top surface of the QFN package of FIG. 1 with a portion of the package encapsulation material removed.

Package 10 is a QFN package including a leadframe with leads 12 and a die attach pad 14, which also serves as a thermal pad, as shown in FIGS. 1 and 2. In at least one example, the leadframe is constructed of copper material, 200 μm (or 8 mils) thick and the width of each lead is 250 μm. Semiconductor die 18 is attached, via a die attach material, to a top surface of die attach pad 14. In the example package 10, wire bonds 20 extend between the leadframe leads and the bond pads or terminals of semiconductor die 18, electrically coupling the bond pads of semiconductor die 18 to associated leads 12. Gold, copper, or palladium coated wire (PCC) are examples of wire that may be used for wire bonds 20. PCC wire is low cost and has a noble finish, mitigating oxidation oxidize but bonding wire having other composition and size can also be used. Mold compound 16 covers the assembly of semiconductor die 18, die support pad 14, and wire bonds 20. Typically, plastic is used as the mold compound, but use of other materials, including ceramics, can also be used.

The exposed surface of the die attach/thermal pad 14 can be soldered to a corresponding pad on a wiring substrate, such as a printed wiring board (PWB) or printed circuit board (PCB), or attached with other heat conductive die attach material. Leads 12 of QFN package 10 can be soldered to corresponding electrical contacts or terminals, on a PWB.

Figure 3:
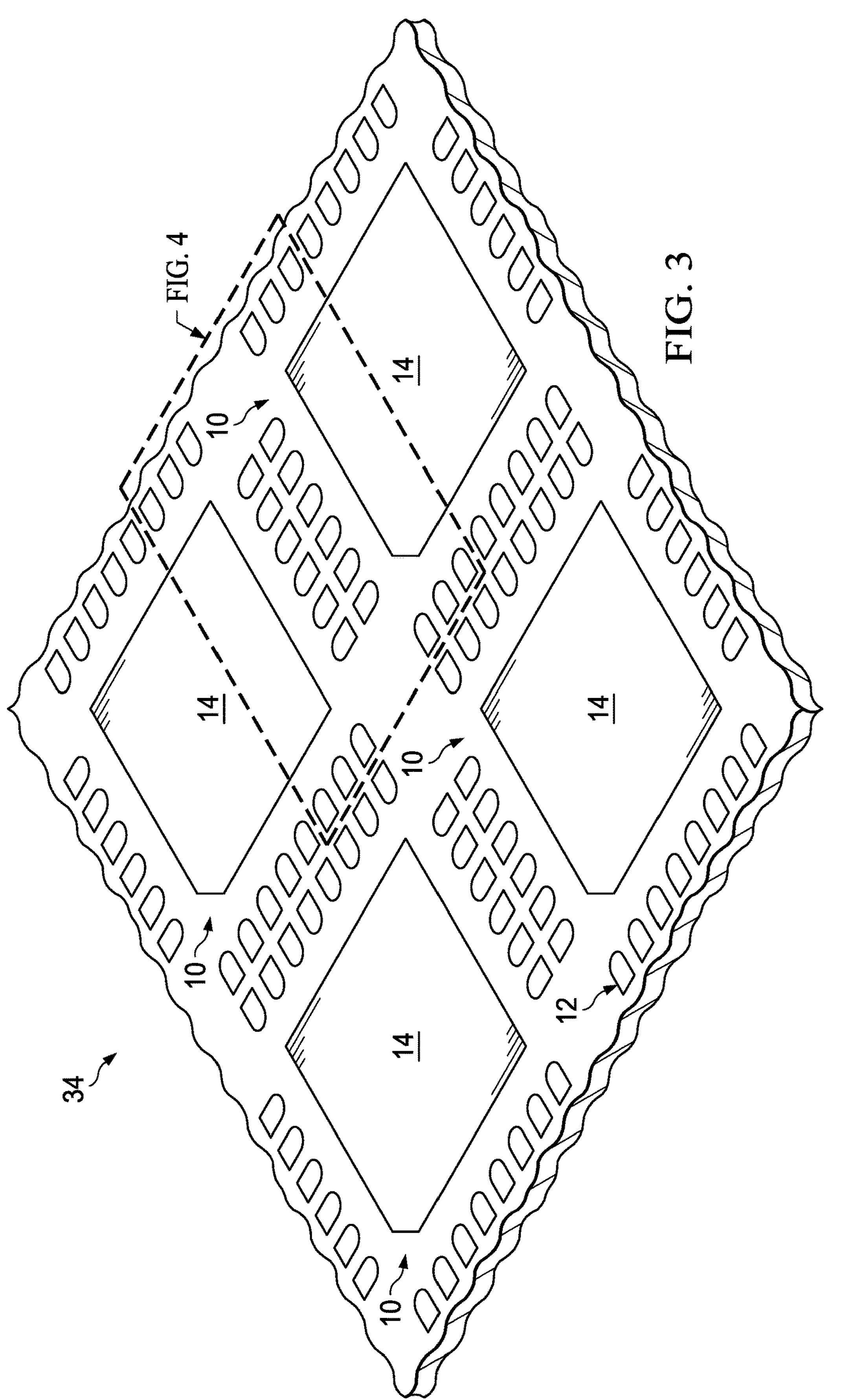
FIG. 3 is a perspective view of multiple QFN packages on a strip assembly subsequent to block molding but prior to singulation.
Figure 4:
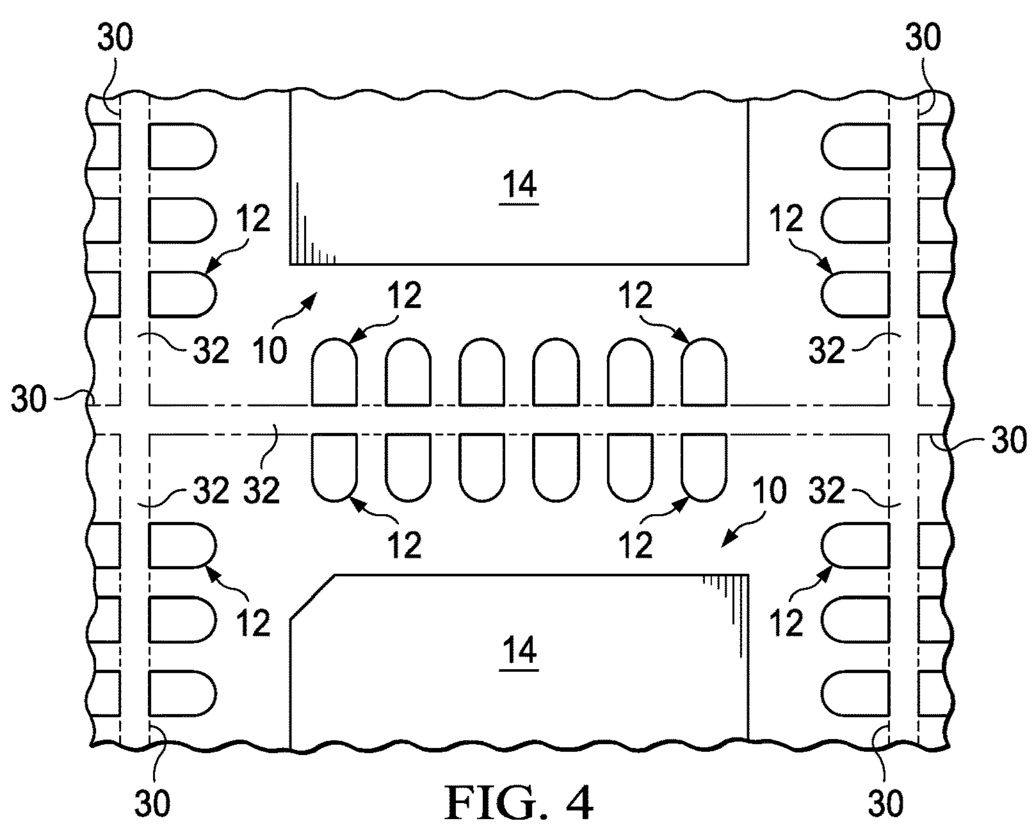
FIG. 4 is a top plan view of a portion of a QFN-type leadframe.

A QFN packages, such as package 10, are commonly manufactured in a batch process as part of a leadframe strip, including leads 12 and pads 14 for each package 10. FIG. 3 illustrates an encapsulated leadframe strip 34 including multiple QFN packages 10, while FIG. 4 is a close-up view including a portion of leadframe strip 34 for two QFN packages 10. With a typical QFN fabrication process, multiple QFN packages 10 are block molded/encapsulated at the same time on a common leadframe strip to form encapsulated leadframe strip 34. While FIG. 3 illustrates four QFN packages 10, a typical leadframe strip includes a much larger array of QFN packages, the array including dozens or hundreds of QFN packages.

Figure 5:
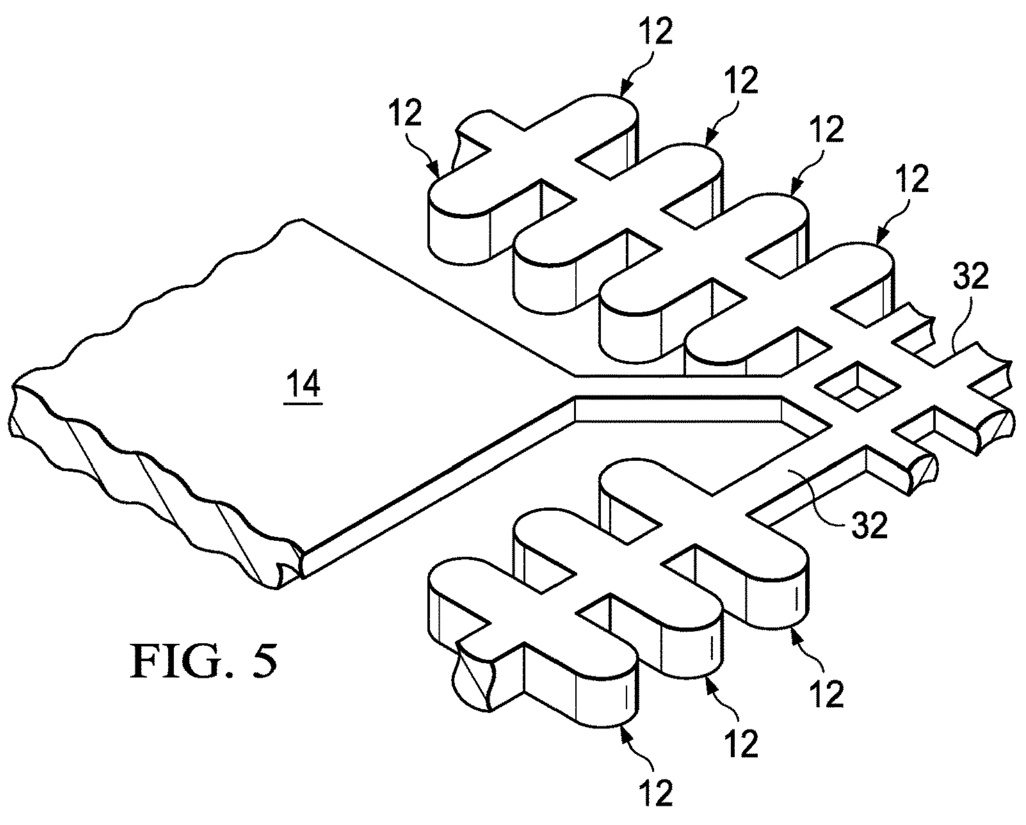
FIG. 5 is a detailed isometric view of a leadframe portion of a leadframe strip

Encapsulated leadframe strip 34 is singulated to produce individual QFN packages 10. As shown in FIGS. 4 and 5, prior to singulation, distal/outer ends of leads 12 of a first QFN package 10 are connected to distal/outer ends of leads 12 of adjacent QFN packages 10 by connecting bars 32. During QFN singulation, connecting bars 32 are completely cut away to separate the leads 12 for the respective QFN packages 10. This is done with a single saw cut along each saw street 30, shown by two dashed lines in FIG. 4. Each of the leads 12 has a proximal/inner end positioned near an associated die pad 14 and a distal end, which forms an end face 15 following singulation. Exposed end faces 15 facilitate visual inspection of solder connections between leads 12 and a wiring substrate.

Following molding and singulation, leads 12 and die attach/thermal pad 14 are partially covered by mold compound 16 with exposed bottom faces 13 being coplanar with the bottom surface of mold compound 16 and exposed end faces 15 being coplanar with side surfaces of mold compound 16. FIG. 1 shows that bottom faces 13 of each of leads 12 are exposed on a bottom surface of QFN package 10 and end faces 15 of each of leads 12 are exposed on a side surface of QFN package 10. The singulation process cuts through an end portion of each of leads 12 with a saw to expose the resulting side surfaces with end faces 15 of each of leads 12, as described with respect to FIG. 6.

Figure 6:
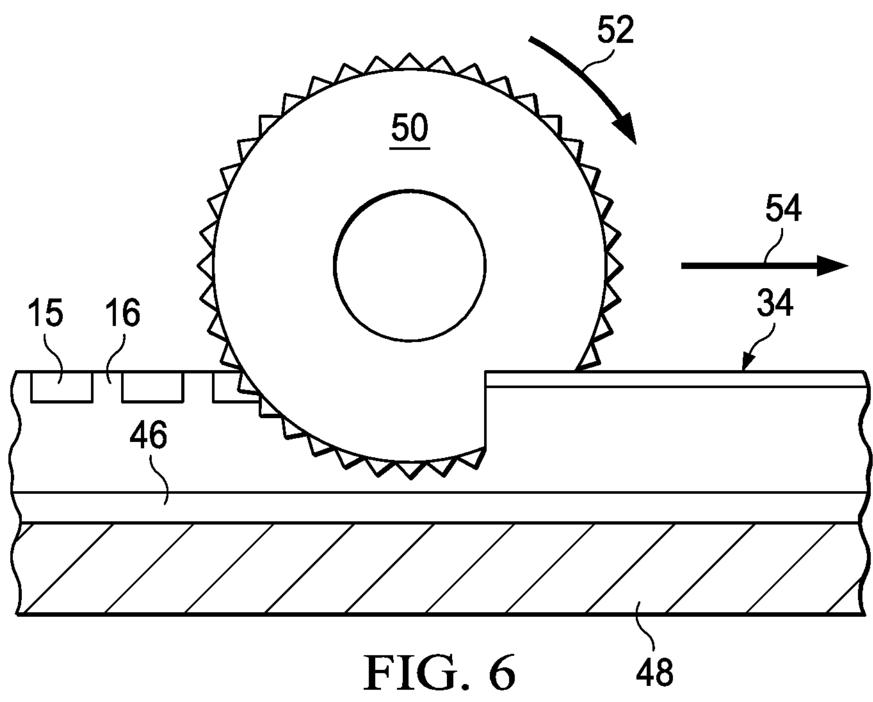
FIG. 6 is a side elevation view of an encapsulated leadframe being singulated with a saw.

FIG. 6 is a schematic side elevation view, illustrating singulation of an encapsulated leadframe strip 34. The encapsulated leadframe strip 34 is supported on a conventional vacuum type leadframe support assembly 46, which is in turn supported on a saw table 48 having a vacuum source associated therewith. Encapsulated leadframe strip 34 is cut by a conventional singulation saw 50 along streets 30 to separate the individual QFN packages 10. Singulation saw 50 rotates in direction 52 and cuts in linear direction 54. Following singulation, end faces 15 of leads 12 are substantially coplanar with a cut side face of the mold compound 16.

Singulation of leadless packages from an encapsulated leadframe strip, such as encapsulated leadframe strip 34, results in heat and friction between the cutting place and leadframe strip. This can create metal burrs and/or metal smearing at end faces of the leads. In packages with small clearance between leads, such metal burrs and/or metal smearing may cause shorting between leads. Metal burrs and/or metal smearing may also cause a finished package to fail inspection.

Figure 7:
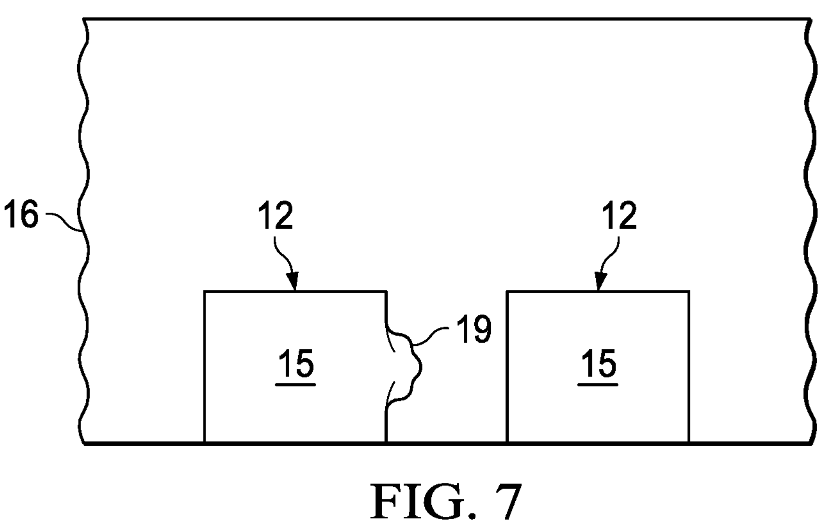
FIG. 7 is an enlarged detail showing exposed leads of a QFN package that were smeared during singulation.

FIG. 7 is a magnified photograph illustrating end faces 15 of adjacent leads 12 of a conventional QFN after saw singulation thereof. It illustrates a significant smearing 19 in the downstream middle side edge of the end face 15 of the first lead 12, caused by heat and friction from the saw blade. In some cases, such smearing is sufficient to cause shorting between adjacent leads 12.

When leads with a narrow pitch are assembled on a wiring substrate, the burrs or metal smears in the cutting direction can lead to short-circuit problems, such as solder bridges. The techniques disclosed herein include alternative lead configurations, such as described with respect to package 110, that may obviate most such shorting problems.

Figure 8:
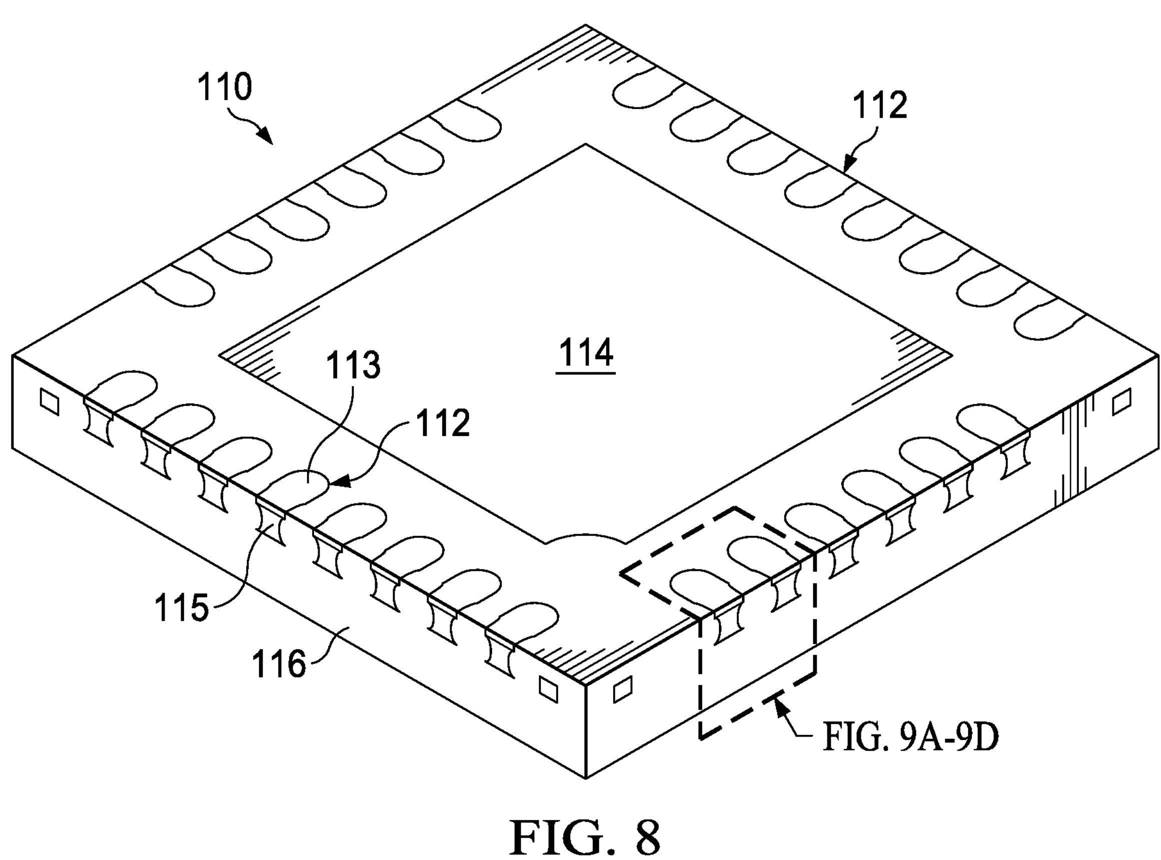
FIG. 8 is a perspective view of a bottom surface of a 28-pin, single row, QFN package with leads having exposed end faces including narrow portions forming concave recesses.
Figure 10:
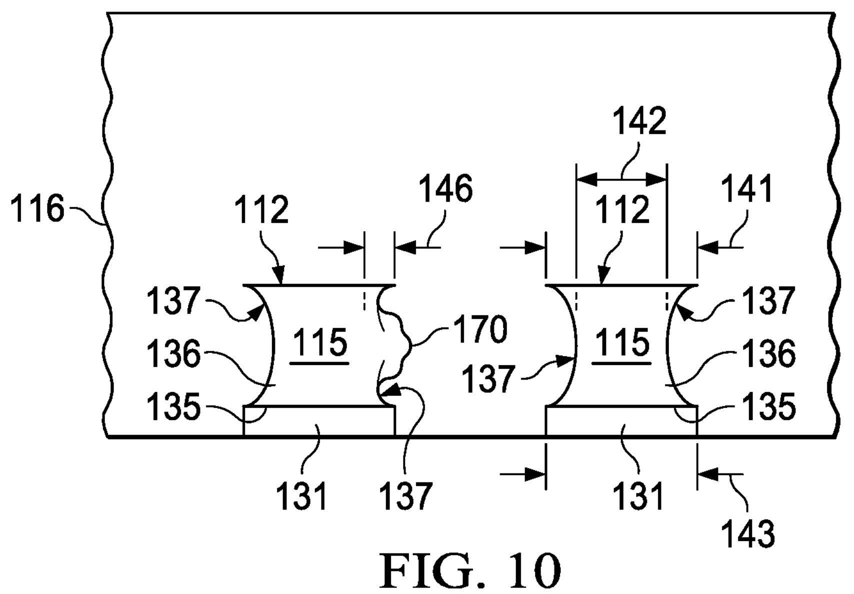
FIG. 10 is a side view of two leads of the QFN package of FIG. 8 including a lead smear from the singulation process for the QFN package.
Figures 9A, 9B, 9C, 9D:
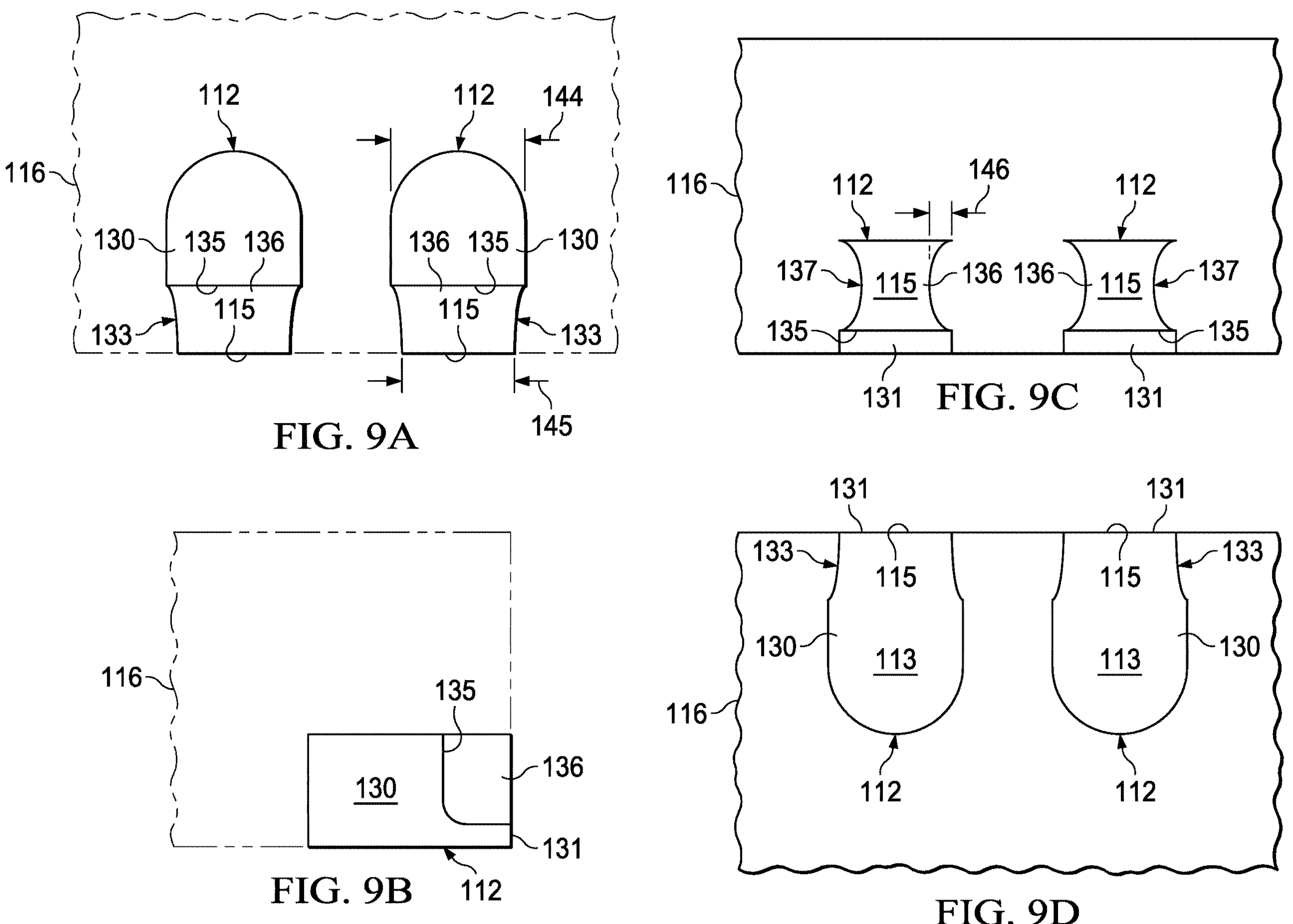
FIGS. 9A-9D are top, side, side, and bottom views of two leads of the QFN package of FIG. 8.

FIGS. 8, 9A-9D and 10 illustrate an example 28-pin, single row, QFN package 110 with leads 112 having exposed end faces 115 including narrow portions 136 forming concave recesses 137. Specifically, FIG. 8 is a perspective view of a bottom surface of QFN package 110. FIGS. 9A-9D are top, side, side, and bottom views of two leads 112 of the QFN package 110. In FIGS. 9A and 9B, mold compound 116 is shown in hidden lines. FIG. 10 is a side view of two leads of QFN package 110 including a lead smear 170 from the singulation process. QFN package 110 is substantially similar to QFN package 10 except that leads 112 include a narrow portion 136 with concave recesses 137 forming an hourglass shape, narrow portion 136 being between top and bottom edges of the exposed end face 115. This modification mitigates problems from lead smear by reducing metal loading along the saw line and providing an area to contain lead smear while maintaining sufficient spacing between adjacent leads.

The hourglass shape is particularly useful as lead smear may be concentrated in the middle of exposed end faces 115. Increasing the distance between the middle of adjacent end faces 115 provides an area where lead smear may be deposited without causing shorting between adjacent leads 112. Compared to simply reducing a maximum width 145 (FIG. 9A) of end faces 115, the hourglass shape of narrow portion 136 of exposed end faces 115 also provides an increased surface area for end faces 115. Further reductions in the surface area of end faces 115 may limit or even prevent solder wetting of end faces 115, thereby reducing the ability of a package to pass visual inspection following mounting on a wiring substrate. Thus, the hourglass shape on exposed end faces 115 of the narrow portion 136 with concave recesses 137 maintains adequate surface area for solder wetting of end faces 115 while also providing an area where lead smear may be deposited without causing shorting between adjacent leads 112. The specific curvature and depths 146 (FIG. 10) for concave recesses 137 may be selected for particular applications to mitigate lead smear while maintaining the solder wettability of end faces 115 to support visual inspection.

Figure 11A:
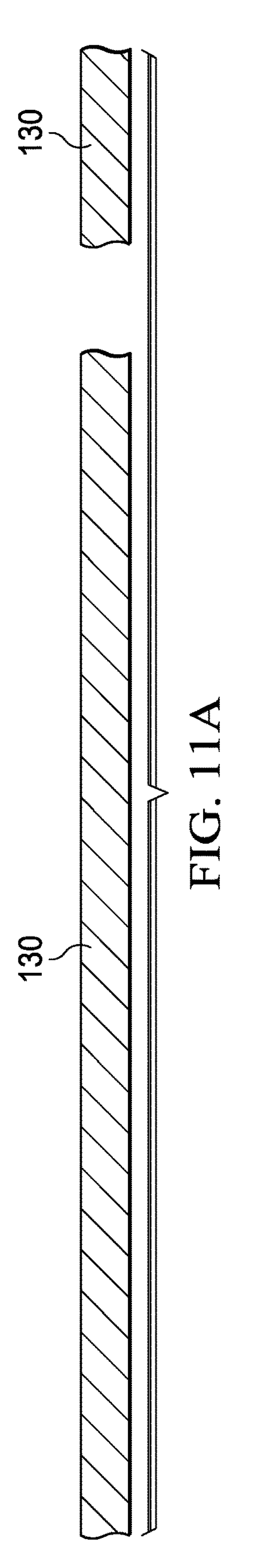
Figure 11B:
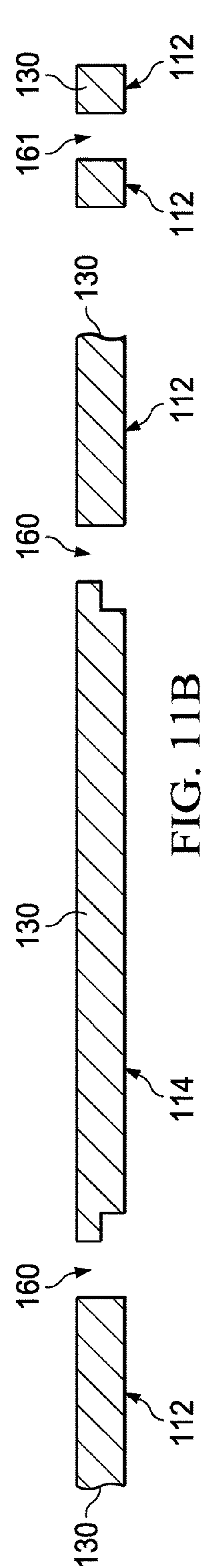
Figure 11C:
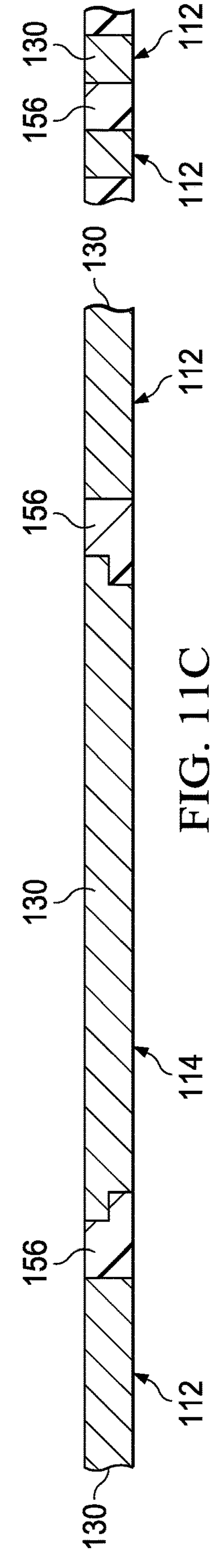
Figure 11G:
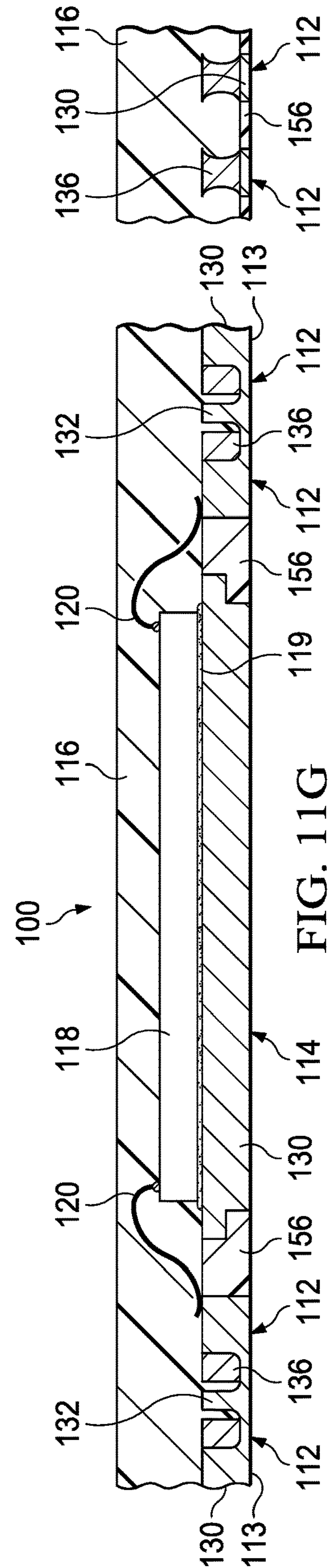

FIGS. 11A-11H each illustrate cutaway front and side views of conceptual process steps for manufacturing a QFN package with leads having exposed end faces including narrow portions forming concave recesses, such as QFN package 110. Of particular note, FIG. 11E illustrates a leadframe strip 150, which includes a pad 114 and leads 112 for an array of packages 110, and FIG. 11G illustrates strip assembly 100, containing an array of QFN packages 110 assembled on a leadframe strip 150 and molded in a single cavity mold.

Figure 11H:
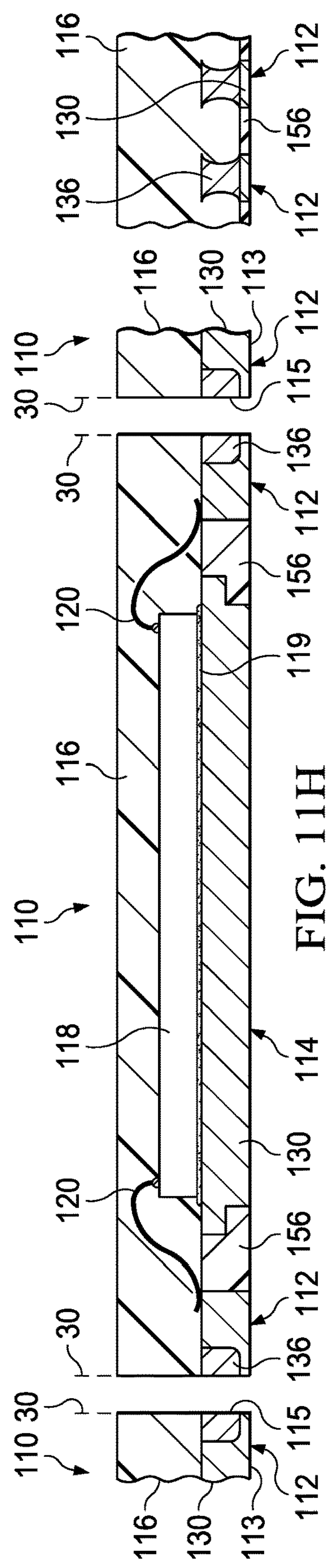

QFN package 110 includes at least one electronic component including terminals, such as a semiconductor die 118 (FIG. 11H). For example, the electronic component may be mounted to pad 114 and covered by mold compound 116. The terminals of electronic component are also electrically connected to at least some of the leads 112 within the package, such as by way of wire bonds 120 (FIG. 11F).

Each of the leads 112 include an exposed bottom face 113 coplanar with a bottom surface of the mold compound 116 and an exposed end face 115 coplanar with one of a plurality of side surfaces of the mold compound 116. For at least some of the leads 112, the exposed end face 115 includes a narrow portion 136 forming a concave recess 137 between top and bottom edges of the exposed end face 115.

QFN packages 110 are mold array process (MAP) type leadless packages. This means QFN packages 110 are molded in a single cavity mold to form strip assembly 100 (FIG. 11G), and singulation includes cutting through the common mold compound 116 to separate strip assembly 100 into individual QFN packages 110. The concave recess 137 for each lead 112 includes the mold compound 116 from the single cavity molding process.

In addition to concave recess 137, leads 112 include another feature to mitigate burrs and metal smear from the singulation process. As best shown in FIG. 9A, a maximum width 145 of the lead 112 at the exposed end face 115 is less than a maximum width 144 of the lead 112 along the exposed bottom face 113. Exposed bottom face 113 includes a tapered area 133 adjacent a distal end of lead 112. The width of exposed bottom face 113 reduces from maximum width 145 to width 144 at the distal end of lead 112. This modification compared to leads 12 of package 10 maintains most of the surface area on the exposed bottom face 113 of lead 112 while increasing the metal to metal spacing of exposed end faces 115. In some particular examples, the maximum width 145 of the lead 112 at the exposed end face 115 may be between 50 and 90 percent of the maximum width 144 of the lead 112 along the exposed bottom face 113, such as between 70 and 80 percent of the maximum width 144 of the lead 112 along the exposed bottom face 113. In one particular example, maximum width 144 of the lead 112 along the exposed bottom face 113 may be 250 microns and maximum width 145 of the lead 112 at the exposed end face 115 may be 200 microns. In this particular example, with a lead pitch of 500 microns, the reduced maximum width 145 of the lead 112 at the exposed end face 115 increases the minimum metal-to-metal spacing of adjacent leads 112 from 250 microns to 300 microns.

As shown in FIG. 10, metal smear 170 generally extends from a center area of the thickness of lead 112 along exposed end face 115. For this reason, increasing metal-to-metal spacing of adjacent leads 112 along the center of end faces 115 further mitigates consequences of metal smearing including shorting and/or failed inspections. Concave recesses 137 each provide a depth 146. Compared to leads 12 of package 10, concave recesses 137 increase the metal-to-metal spacing of adjacent leads 112 along the center of end faces 115 but still allow a larger surface area of end faces 115 compared to further reductions in a maximum width 143 of ends faces 115. Further reductions in the surface are of end faces may limit or even prevent solder wetting of end faces 115, thereby reducing the ability of a package to pass visual inspection following mounting on a wiring substrate.

As best shown in FIG. 10, the exposed end face 115 defines a first width 141 adjacent to the bottom surface, a second width 142 at the narrow portion 136, the second width 142 further from the bottom surface than the first width 141, and a third width 143 further from the bottom surface than the second width 142. Each of the first width 141, the second width 142, and the third width 143 are measured parallel to the bottom surface of the mold compound 116 along the one of the plurality of side surfaces of the mold compound 116. Due to the curvature of concave recesses 137, the second width 142 is smaller than both the first width 141 and the third width 143.

The particular curvature of concave recesses 137 can be selected to mitigate metal smears of a particular package design. Examples curvatures for concave recesses 137 include, but are not limited to, catenaries, parabolas, hyperboloids, steps, and irregular curves. As discussed in further detail with respect to FIG. 11E, the particular shape of concave recesses 137 may be selected by additive manufacturing narrow portion 136 on a rectangular portion 131 of base metal 130 at the distal ends of leads 112.

Figure 12:
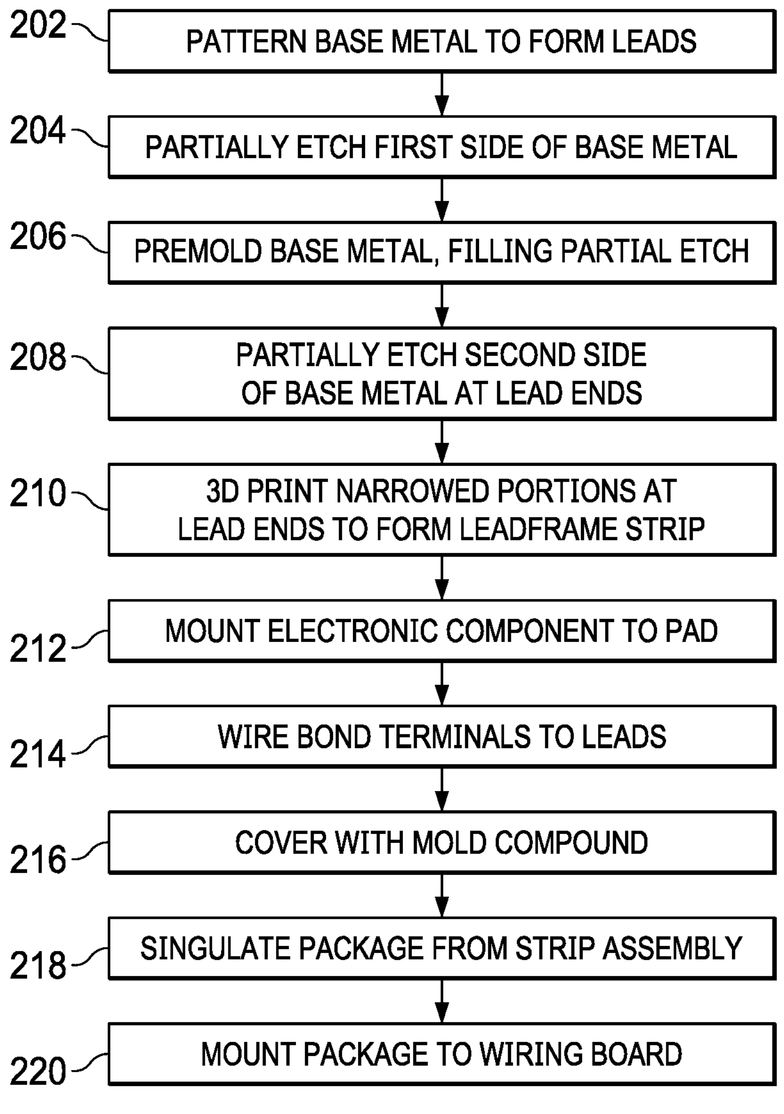
FIG. 12 is a flowchart of a method of manufacturing a QFN package with leads having exposed end faces including narrow portions forming concave recesses, such as the package of FIG. 8.

Further details regarding the structures and configurations of QFN package 110 are provided with respect to FIGS. 11A-11H. FIGS. 11A-11H each illustrate cutaway front and partial side views of conceptual process steps for manufacturing a QFN package with leads having exposed end faces including narrow portions forming concave recesses, such as QFN package 10. FIG. 12 is a flowchart of a method of manufacturing a QFN package with leads having exposed end faces including narrow portions forming concave recesses, such as QFN package 10. For clarity, the method of FIG. 12 is described with reference to package 110 and FIGS. 11A-11H; however, the described techniques are not limited to the specific example of package 110, and may be adapted to other package designs.

FIG. 11A illustrates a cutaway side view of a base metal 130 for leadframe strip 150. Base metal 130 is a single thin (about 120 to 250 μm) sheet of metal formed into leadframe strip 150 by stamping or etching. The ductility in this thickness range provides the 5 to 15% elongation that facilitates an intended bending and forming operation. The configuration or structure of the leadframe strip 150 is stamped or etched from the starting metal sheet.

Base metal 130 predominantly includes copper, such as a copper alloy. As referred to herein, "predominately including" means greater than fifty percent by weight, up to one hundred percent by weight. Examples of suitable copper alloys for base metal 130 include aluminum bronze (copper ninety-two percent by weight, aluminum eight percent by weight), beryllium copper (copper ninety-eight percent by weight, beryllium two percent by weight), cartridge brass (copper seventy percent by weight, zinc thirty percent by weight), cupronickel (copper seventy percent by weight, nickel thirty percent by weight), gunmetal (copper ninety percent by weight, tin ten percent by weight). nickel silver (copper seventy-eight percent by weight, nickel twelve percent by weight, lead ten percent by weight), as well as copper alloys C19210, C19400, and C70250 under the unified numbering system. In other examples base metal 130 may predominantly include iron-nickel alloys (for instance the so-called "Alloy 42"), or aluminum.

FIG. 11B illustrates patterning base metal 130 by patterning a base metal 130 to form leads 112 for each of the array of electronic packages 110. The patterning includes etching or stamping to form individual lead fingers (FIG. 12, step 202) between gaps 161 and partially etching a first side of the base metal 130 to form recess 160 (FIG. 12, step 204). Recess 160 surrounds pads 114 of leadframe strip 150.

As shown in FIG. 11C, the patterned and partially etched base metal of FIG. 11B is premolded with premold material 156 to fill the recess 160 of the partial etch (FIG. 12, step 206). Premold material 156 fills the recess 160 and the gaps 161 between the lead fingers of base metal 130. In some examples, premold material 156 may be a plastic mold compound.

As shown in FIG. 11D, a second side of base metal 130 is partially etched, forming recesses 162 (FIG. 12, step 208). Recesses 162 thin the lead fingers of base metal 130, leaving rectangular base portions 131 of the base metal 130 at ends of the leads 112 on the second side of the base metal 130. After the partial etch, tie bars 132 remain between adjacent lead fingers.

As shown in FIG. 11E, narrow portions 136 of leads 112 are added to rectangular base portions 131 of the base metal 130 to form a completed leadframe strip 150. Specifically, a second metal is built-up over the rectangular base portion 131 of the lead 112 end on the second side of the base metal 130 using additive manufacturing, such as 3D printing (FIG. 12, step 210) to build-up layers on rectangular base portions 131. Following the 3D printing, each lead 112 primarily includes a base metal 130 extending to include the rectangular base portion 131 of the exposed end face 115, but not the narrow portion 136 of the exposed end face 115. Instead, the 3D printed metal forms narrow portion 136.

The completed leadframe strip 150 includes patterned base metal 130 forming leads 112 for each of the array of electronic packages 110, and premold material 156 filling recess 160, a first partial etch of a first side of the base metal 130. The patterned base metal 130 forms rectangular base portions 131 of the base metal 130 at ends of the leads 112 on a second side of the base metal 130. Leadframe strip 150 further includes a second metal, the 3D printed metal, over the rectangular base portion 131 of the lead 112 end on the second side of the base metal 130. As described previously, the second metal forms a narrow portion 136 forming a concave recess 137 on the rectangular base portion 131.

Due to the shape of narrow portion 136 with concave recess 137, it is not possible to form narrow portion 136 by simply etching the second side of base metal 130. Additive manufacturing allows end faces 115 of leads 112 to include recessed curves and other complex shapes, such as catenaries, parabolas, hyperboloids, steps, and irregular curves.

The additive manufacturing forms a seam 135 at the interface of base metal 130 and the metal of narrow portion 136. For example, the seam 135 may represent an interface between a metal grain structure of the base metal 130, and a metal grain structure of the narrow portion 136. Whereas base metal 130 may have a small metal grain structure, additive manufacturing may produce larger metal grains oriented generally parallel to a thickness of base metal 130. However, the differences in metal grain structure may be reduced through optional heat treatment. In the same or different examples, seam 135 may represent interface between a first metal composition the base metal 130, and a second metal composition of the narrow portion 136. For example, both base metal 130 and the metal narrow portion may be primarily copper, but the alloying elements may be measurably.

As shown in FIG. 11F, semiconductor die 118 is mounted to leadframe strip 150 at pad 114 (FIG. 12, step 212). While only a single semiconductor die 118 is illustrated, a semiconductor die 118 is mounted to each pad 114 of leadframe strip 150. Mounting semiconductor die 118 to pad 114 may include securing an inactive side of semiconductor die 118 to pad 114 with a die attach material, such as die attach paste 119. Terminals on the active side of semiconductor die 118 are connected to leads 112 with wire bonds 120 (FIG. 12, step 214).

As shown in FIG. 11E, leadframe strip 150, semiconductor die 118 and wire bonds 120 are molded in a batch process for an array of packages 110 with mold compound 116 to form strip assembly 100 (FIG. 12, step 216). In some examples, mold compound 116 includes an epoxy such as an epoxy-based thermoset polymer. Strip assembly 100 includes leadframe strip 150, which includes a pad 114 and leads 112 for each package 110. Leadframe strip 150 further includes tie bars 132 which interconnect pad 114, leads 112 and other elements of the leadframes to one another as well as to elements of adjacent leadframes in a leadframe strip. Leadframes on leadframe strip 150 are arranged in rows and columns. A siderail may surround the array of leadframes to provide rigidity and support leadframe elements on the perimeter of the leadframe strip. The siderail may also include alignment features to aid in manufacturing. The siderail and portions of tie bars 132 are removed during singulation.

Mold compound 116 provides a protective outer layer for semiconductor die 118 and wire bonds 120 in each package 110. In strip assembly 100, each semiconductor die 118 and wire bonds 120 are covered with mold compound 116, while leads 112 are partially covered with mold compound 116, with bottom faces 113 of leads 112 remaining exposed.

First, strip assembly 100, including a number of QFN packages 110, is assembled on a common leadframe strip 150. Each QFN package on the leadframe strip 150 includes an electronic component including terminals. The assembly process includes mounting the electronic component(s) for each package 110 to leadframe strip 150 and electrically connecting the terminals of the electronic component to at least some of the leads 112 of the leadframe strip 150. For example, electrically connecting the terminals of the electronic component to at least some of the leads 112 may include wire bonding (FIG. 8, step 202).

All of the QFN packages 110 of strip assembly 100 are bulk encapsulated with plastic mold compound 116, with only the bottom surface of each package 110 not being completely covered with the mold compound, leaving bottom surfaces of leads 112 and pads 114 uncovered (FIG. 8, step 204). In this process, leadframe strip 150, with the attached electronic components of QFN packages 110, is placed in the cavity of a mold, such as a steel mold. A heated and viscous mold compound, such as an epoxy resin filled with inorganic granules, such as alumina and silicon dioxide, is pressured into the cavity to fill the cavity and surround the electronic components and leadframe strip 150 portions without voids. Mold compound 116 covers pad 114 and at least portions of leads 112. Mold compound 116 may require an extended polymerization period ("curing"; commonly at 175° C. for 5 to 6 hours). After polymerizing the mold compound and cooling to ambient temperature, the mold is opened, while mold compound 116 remains adhered to the molded parts. Individual QFN packages 110 remain interconnected as part of strip assembly 100 after being covered with mold compound 116.

Following molding, QFN packages 110 may be tested for quality and functionality before or after singulation.

As shown in FIG. 11H, package 110 is singulated from strip assembly 100 using a substantially similar process as described with respect to FIG. 4 (FIG. 12, step 218). Singulation includes cutting leadframe strip 150 and mold compound 116 to separate each package 110 from strip assembly 100. During singulation, tie bars 132 are removed and end faces 115 of leads 112 are exposed for each package 110. Each end face 115 is coplanar with the adjacent side surface of the mold compound 116. As best illustrated in FIG. 10, each of the exposed end face 115 includes a rectangular base portion 131 adjacent to the bottom surface with the concave recess 137 being further from the bottom surface than the rectangular base portion 131. One or more of the exposed end faces 115 may include a metal smear or burr as a result of the singulation process.

Following singulation, each QFN package 110 is ready for mounting to a wiring board (FIG. 12, step 220). Even though some of leads 112 may include a metal smear, such as metal smear 170 (FIG. 10), the design of leads 112 including end face 115 with width 145 (FIG. 9A) and narrow portion 136, mitigates the chances that the metal smear impacts the function of the package 110.

The specific techniques for leadless semiconductor packages with leads having exposed end faces including narrow portions forming concave recesses, such as described with respect to package 110 are merely illustrative of the general inventive concepts included in this disclosure as defined by the following claims. For example, while the disclosed examples refer to QFN packages with semiconductor dies, the disclosed techniques may be applied to any electronic package with a lead, including package configurations other the QFN, and/or electronic packages with any combination of active and passive components on a leadframe instead of or in addition to a semiconductor die.

What is claimed is:

1. An electronic package comprising:

an electronic component including terminals;

a plurality of leads, at least some of the leads being electrically coupled to the terminals within the electronic package; and a mold compound covering the electronic component and partially covering the leads, wherein each of the leads include an exposed bottom face coplanar with a bottom surface of the mold compound and an exposed end face coplanar with one of a plurality of side surfaces of the mold compound, and wherein for at least some of the leads, the exposed end face includes an hourglass shape including a concave recess over a rectangular portion of a base metal of the plurality of leads.

2. The electronic package of claim 1, wherein for each of the leads with the concave recess, the concave recess includes the mold compound.

3. The electronic package of claim 1, wherein for at least one of the leads with the concave recess, the concave recess includes a metal smear extending from the one of the leads with the concave recess.

4. The electronic package of claim 1, wherein for each of the leads with the concave recess, the exposed end face defines a first width adjacent to the bottom surface of the mold compound, a second width at the narrow portion, the second width further from the bottom surface than the first width, and a third width further from the bottom surface than the second width, each of the first width, the second width, and the third width being measured parallel to the bottom surface along the one of the plurality of side surfaces of the mold compound, and wherein the second width is smaller than both the first width and the third width.

5. The electronic package of claim 1, wherein for each of the leads with the concave recess, the exposed end face includes a rectangular base portion adjacent to the bottom surface with the concave recess being further from the bottom surface than the rectangular base portion.

6. The electronic package of claim 5, wherein for each of the leads with the concave recess, the lead primarily includes a base metal extending to include the rectangular base portion of the exposed end face, but not the narrow portion of the exposed end face, and wherein for each of the leads with the concave recess, the lead includes a seam between the rectangular base portion and the narrow portion.

7. The electronic package of claim 6, wherein the seam represents an interface between a metal grain structure of the base metal, and a metal grain structure of the narrow portion.

8. The electronic package of claim 6, wherein the seam represents an interface between a first metal composition the base metal, and a second metal composition of the narrow portion.

9. The electronic package of claim 1, wherein for each of the leads with the concave recess, a maximum width of the lead at the exposed end face is less than a maximum width of the lead along the exposed bottom face.

10. The electronic package of claim 1, further comprising wire bonds electrically coupling the terminals of the electronic component to the leads, the mold compound covering the wire bonds.

11. The electronic package of claim 1, wherein the electronic component includes a semiconductor die.

12. A leadframe strip for an array of electronic packages comprising:

a patterned base metal forming leads for each of the array of electronic packages; and a premold material filling a first partial etch of a first side of the base metal, wherein the patterned base metal forms rectangular base portions of the base metal at lead ends of the leads on a second side of the base metal, wherein each of the lead ends includes a second metal over the rectangular base portion of the lead end on the second side of the base metal, the second metal forming a narrow portion forming a concave recess on the rectangular base portion.

13. The leadframe strip of claim 12, wherein for each of the lead ends, the narrow portion defines a first width adjacent to the first side of the base metal, a second width at the narrow portion, the second width further from first side of the base metal than the first width, and a third width further from first side of the base metal than the second width, each of the first width, the second width, and the third width being measured parallel to the first side of the base metal, and wherein the second width is smaller than both the first width and the third width.

14. The leadframe strip of claim 12, wherein for each of the leads, the lead includes a seam between the rectangular base portion and the narrow portion.

15. The leadframe strip of claim 14, wherein the seam represents an interface between a metal grain structure of the base metal, and a metal grain structure of the narrow portion.

16. The leadframe strip of claim 14, wherein the seam represents an interface between a first metal composition the base metal, and a second metal composition of the narrow portion.

17. The leadframe strip of claim 12, wherein for each of the leads, a maximum width of the lead at the lead end is less than a maximum width of the lead along the first side of the base metal.

* * * * *